United States Patent [19]
Koerner et al.

[11] Patent Number: 5,519,318
[45] Date of Patent: May 21, 1996

[54] TRIAXIAL MAGNETIC HEADING SENSING APPARATUS HAVING MAGNETARESISTORS AND NULLING COILS

[75] Inventors: Steve J. Koerner, Inyokern; Anthony E. Lifur; Michael J. Wall, both of Ridgecrest, all of Calif.

[73] Assignee: The United States of America as represented by the Secretary of the Navy, Washington, D.C.

[21] Appl. No.: 997,043

[22] Filed: Dec. 28, 1992

[51] Int. Cl.$^6$ .................................................. G01R 33/02
[52] U.S. Cl. ........................................... 324/252; 324/247
[58] Field of Search ................................... 324/247, 252; 33/356, 361, 362

[56] References Cited

U.S. PATENT DOCUMENTS 4,656,750  4/1987  Pitt et al. ................................. 324/251

FOREIGN PATENT DOCUMENTS 58-154680  9/1983  Japan ..................................... 324/252
1202533    8/1970  United Kingdom ................... 324/247

OTHER PUBLICATIONS

Philips Components, Data Sheets—3 pages "Magnetic Field Sensor" Dec. 1989.

*Primary Examiner*—Walter E. Snow
*Attorney, Agent, or Firm*—Harvey A. Gilbert; Robert J. Hampsch

[57] ABSTRACT

A triaxial magnetic heading sensing apparatus includes nulling coils and magnetoresistive sensors having inputs and outputs. The nulling coils are arranged in parallel relation to three orthogonal planes intersecting at a common center point. The sensors are disposed along orthogonal axes in parallel relation to the orthogonal planes and in close proximity to the center point. Each sensor has a bridge configuration balanced in the absence of an applied external magnetic field and unbalanced in the presence one. Also, a signal generator is connected to the inputs of the sensors for exciting the sensors with a bipolar voltage waveform exhibiting alternating positive and negative voltage polarities punctuated by "off" states of zero volts. Further, a voltage integrator and low pass filter are connected in series with the output of a respective one of the sensors for generating an error signal representative of an imbalance due to the presence of an applied external magnetic field and for coupling the input and output of each nulling coil and of each sensor into a servo control loop such that each sensor is driven by the error signal to a magnetic nulling condition with zero steady state error. A pick-off resistor is connected to the output of the low pass filter for outputting a representation of the nulling current to provide a measure of the applied external magnetic field.

22 Claims, 5 Drawing Sheets

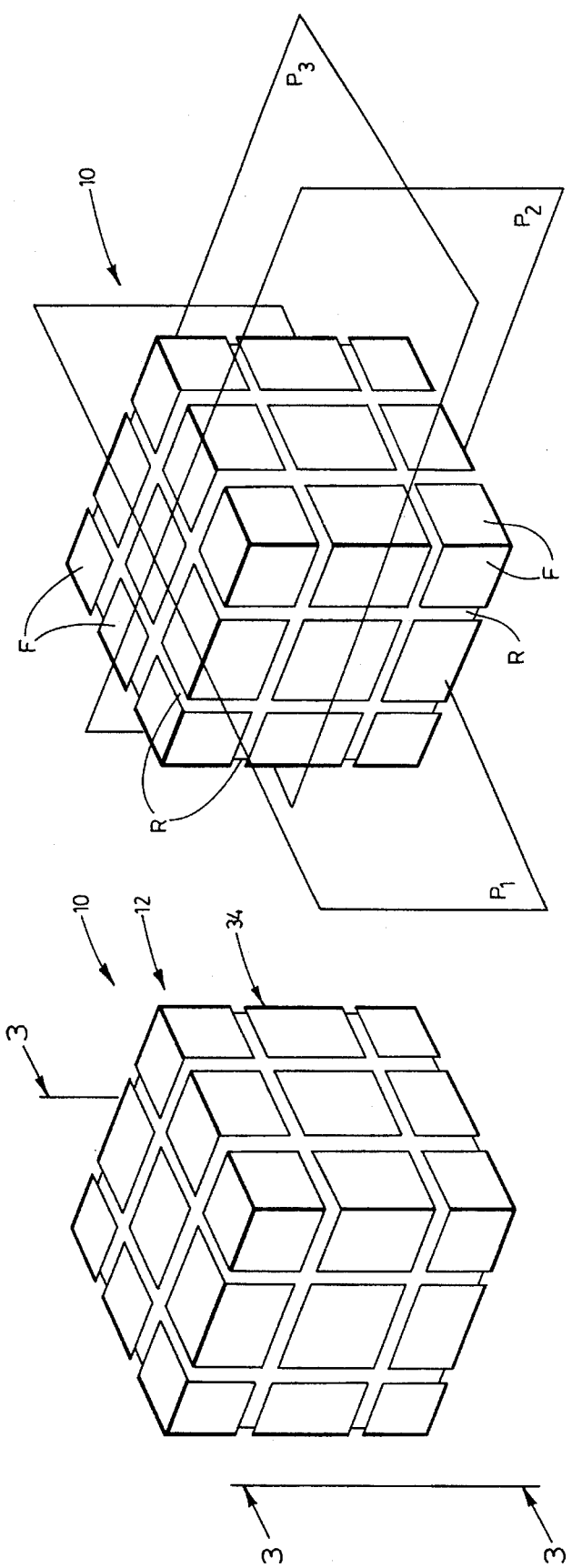

BRIDGE EXCITATION WAVEFORM

TRIAXIAL MAGNETIC HEADING SENSING APPARATUS HAVING MAGNETARESISTORS AND NULLING COILS

BACKGROUND OF THE INVENTION

1. Field of the Invention

The present invention generally relates to apparatus for measuring the earth's magnetic field and, more particularly, is concerned with a triaxial magnetic heading sensing apparatus which provides for simultaneous nulling of orthogonally positioned magnetic field sensors.

2. Description if the Prior Art

Because of the importance of magnetic compass technology to vehicle navigation, there have been a large number of technological approaches taken to the design of electronic compass sensors. Some early approaches involved the use of electrical pick-off mechanisms to detect the position of a mechanical compass needle. Other mechanisms have involved the use of spinning search coils from which magnetic field direction can be derived from the phase of the induced voltage. More modern approaches have been primarily focused on electronic technologies that do not employ moving parts.

Among the electronic technologies that have been applied to low field magnetometry, and in particular to compass applications, the flux gate type magnetometer has received the greatest commercial success. Flux gate magnetometers employ high permeability magnetic cores that are stimulated by an applied AC field. In flux gate operation, the magnetic core material is made to saturate in alternating directions along the axis of the magnetic core in response to the applied field from the primary winding. A system of one or more secondary windings is used to detect the core saturation. In the presence of an external magnetic field the saturation characteristics are asymmetric and the degree of asymmetry provides a direct indication of the strength of the external magnetic field along the axis of the core. Commonly, two orthogonal flux gate magnetometers are used in a gimbal structure or three orthogonal magnetometers are used for strap-down applications. Two axes flux gate sensors have also been employed which utilize torodial cores and multiple secondary windings.

Flux gate magnetometer sensors are inherently sensitive to the magnetic properties of the core material. Exotic, low coercivity alloys are used for the flux gate core which must be precisely annealed to preserve the required characteristics. Seemingly innocuous chemical contamination of the material or mechanical manipulation can alter the core's magnetic properties significantly. Moderately complex circuitry is required to stimulate the core and interpret the second harmonic secondary signals. To obtain an approximate zero balance, the coil windings must be tediously adjusted to desired nulling points.

In light of these considerations it is relatively expensive to build a flux gate magnetometer based compass sensor which is accurate to the degree required for aircraft navigation over the typical temperature range for flight vehicles.

SUMMARY OF THE INVENTION

The present invention satisfactorily addresses the need for a small, low cost magnetic compass sensor with an accuracy commensurate with the requirements of aircraft and missile navigation by providing a triaxial magnetic compass sensing apparatus. The triaxial magnetic heading sensing apparatus employs a topology of three accurately orthogonal concentric helmholtz nulling coils and three magnetic field sensors coarsely aligned with the helmholtz axes and collocated near the center of the concentric coils. The three orthogonal components of the magnetic field can be determined by simultaneously nulling the three sensors. The resultant accuracy of measurement is limited only by the geometric accuracy of the helmholtz coils. Misalignment of the null detecting sensors of the apparatus contributes no error to the measurement.

Accordingly, the present invention is directed to a triaxial magnetic heading sensing apparatus which comprises: (a) a plurality of nulling coils having inputs and outputs and being arranged in generally parallel relation to three orthogonal planes intersecting at a common center point; (b) a plurality of magnetoresistive sensors having inputs and outputs and being disposed along orthogonal axes arranged in generally parallel relation to the orthogonal planes and in close proximity to the common center point, each sensor comprising a resistive bridge approximately balanced in the absence of an applied external magnetic field and unbalanced in the presence of an applied external magnetic field; (c) means connected to the inputs of the sensors for exciting the sensors with a bipolar voltage waveform exhibiting alternating positive and negative voltage polarities punctuated by "off" states of zero volts; (d) means connected to the outputs of the sensors for generating an error signal representative of imbalance due to the presence of an applied external magnetic field and for coupling the inputs and outputs of the nulling coils and magnetoresistive sensors into a servo control loop such that each sensor is driven by the error signal to a magnetic nulling condition with zero steady state error; and (e) means connected to the servo control loop for outputting the error signal to provide a measure of the applied external magnetic field.

Also, the sensing apparatus comprises a support block for supporting the nulling coils in the parallel relation to the three orthogonal planes about the common center point, and a compass probe for supporting the sensors along the orthogonal axes and in close proximity to the common center. The support block has a hollow interior cavity and is cubic in shape. The support block has a plurality of faces and a plurality of linear recesses defined in the faces about the support block so as to provide a plurality of square-shaped grooves about the exterior of the support block in parallel relation to the three orthogonal planes about the common center point. The nulling coils are located in the grooves. In particular, the grooves are arranged in three sets of generally parallel pairs of grooves so as to arrange the nulling coils as three orthogonal helmholtz coil pairs with the coils of each pair connected in a series aiding relation. The compass probe is disposed in the hollow interior cavity of the support block. Each sensor is configured as a four-element resistive bridge having first and second pairs of terminals. The first pair of terminals being the input of the sensor is connected to the exciting means. The second pair of terminals being the output of the sensor is connected in the servo control loop defining means.

Further, the sensor exciting means includes a bridge defined by a plurality of low resistance MOSFET devices connected in an H-shaped configuration and means connected to the H-shaped bridge for feeding signals to the H-shaped bridge for determining the timing for the excitation waveform. The sensors are connected to the H-shaped bridge in a parallel relation to one another. Also, the coupling means includes a voltage integrator and a low pass filter connected in series to the output of a respective one of the sensors for generating the error signal. The outputting means is a pick-off resistor connected to an output of the low pass filter.

Still further, the sensing apparatus comprises a plurality of flip coils each being wound around one of the sensors. The exciting means is coupled to the flip coils for activating the flip coils to cause reversal of magnetic polarity of the sensors during the off states of the excitation voltage waveform.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which:

FIG. 2a and FIG. 2b are perspective views of the magnetic sensor assembly of the apparatus of FIG. 1.

FIG. 3 is an enlarged sectional view of three triaxially mounted hulling coils of the magnetic sensor assembly taken along line 3—3 of FIG. 2a.

DETAILED DESCRIPTION OF THE INVENTION

Triaxial Magnetic Heading Sensing Apparatus

Figure 1:
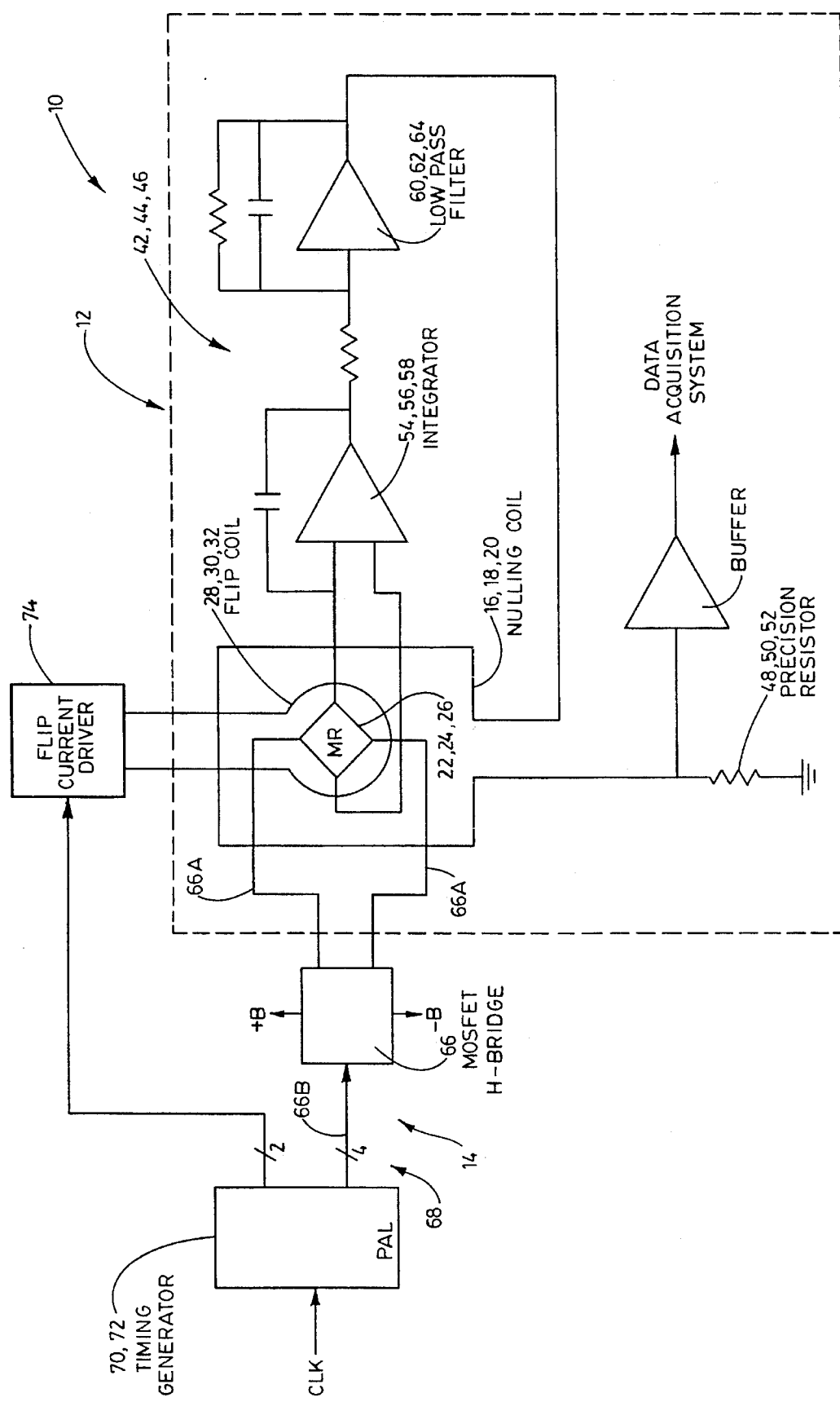
FIG. 1 is a general block diagram of a triaxial magnetic heading sensing apparatus of the present invention.
Figure 4:
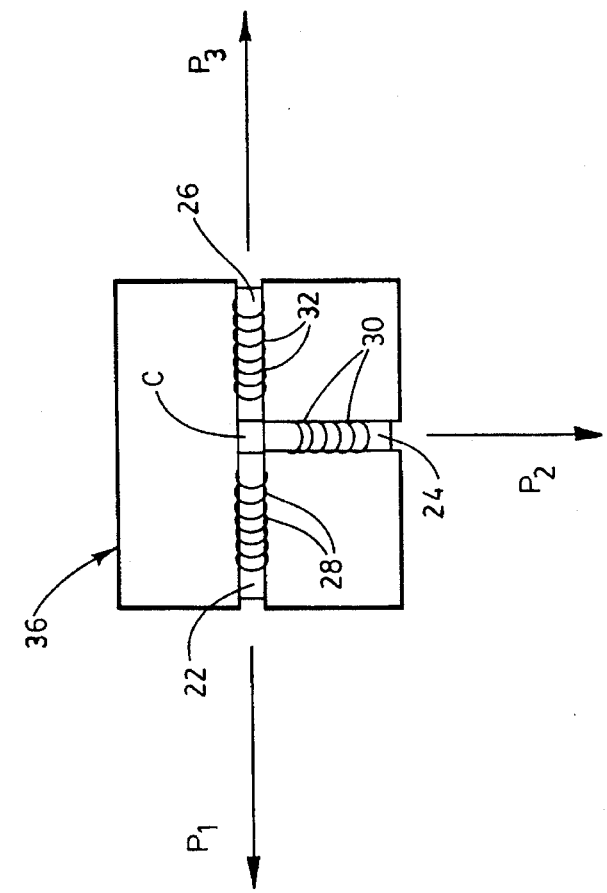
FIG. 4 is an enlarged view of the three triaxially mounted magnetoresistive sensors of the magnetic sensor assembly.

Referring now to the drawings, and particularly to FIGS. 1, 6a and 6b, there is shown a general block diagram of a triaxial magnetic heading sensing apparatus of the present invention, being generally designated by the numeral 10. Basically, the triaxial magnetic heading sensing apparatus 10 includes a magnetic sensor portion 12 and a sensor excitation portion 14.

Figure 3:
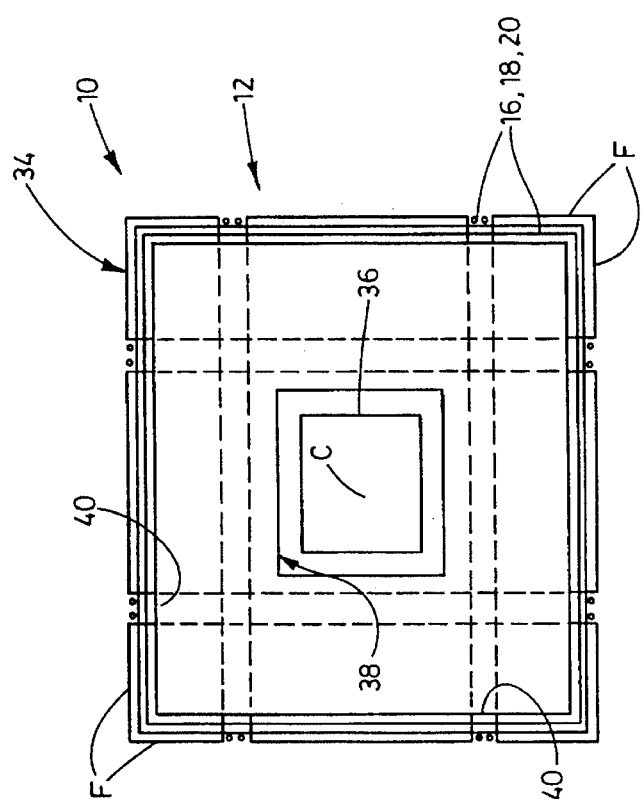

The magnetic sensor portion 12 of the sensing apparatus 10 includes a plurality of triaxially-mounted nulling coils 16, 18, 20 and a plurality of triaxially-mounted magnetoresistive sensors 22, 24, 26. The nulling coils 16, 18, 20 have respective inputs and outputs 16A, 16B, 18A, 18B, 20A, 20B and are arranged in generally parallel relation to three orthogonal planes $P_1, P_2, P_3$ which intersect at a common center point C. (See FIG. 2b and FIG. 3).

The magnetoresistive sensors 22, 24, 26 have respective inputs and outputs 22A, 22B, 24A, 24B, 26A, 26B. The sensors 22, 24, 26 are disposed along three orthogonal axes arranged in generally parallel relation to the three orthogonal planes $P_1, P_2, P_3$ and in close proximity to the common center point C. (See FIG. 2b, and FIG. 3). Each of the sensors 22, 24, 26 has a bridge configuration being approximately balanced in the absence of an applied external magnetic field and unbalanced in the presence of an applied external magnetic field.

The magnetic sensor portion 12 also includes a plurality of flip coils 28, 30, 32. Each flip coil 28, 30, 32 is wound around one of the magnetoresistive sensors 22, 24, 26 in each of the three measurement channels (M1,M2,M3).

Figure 6:
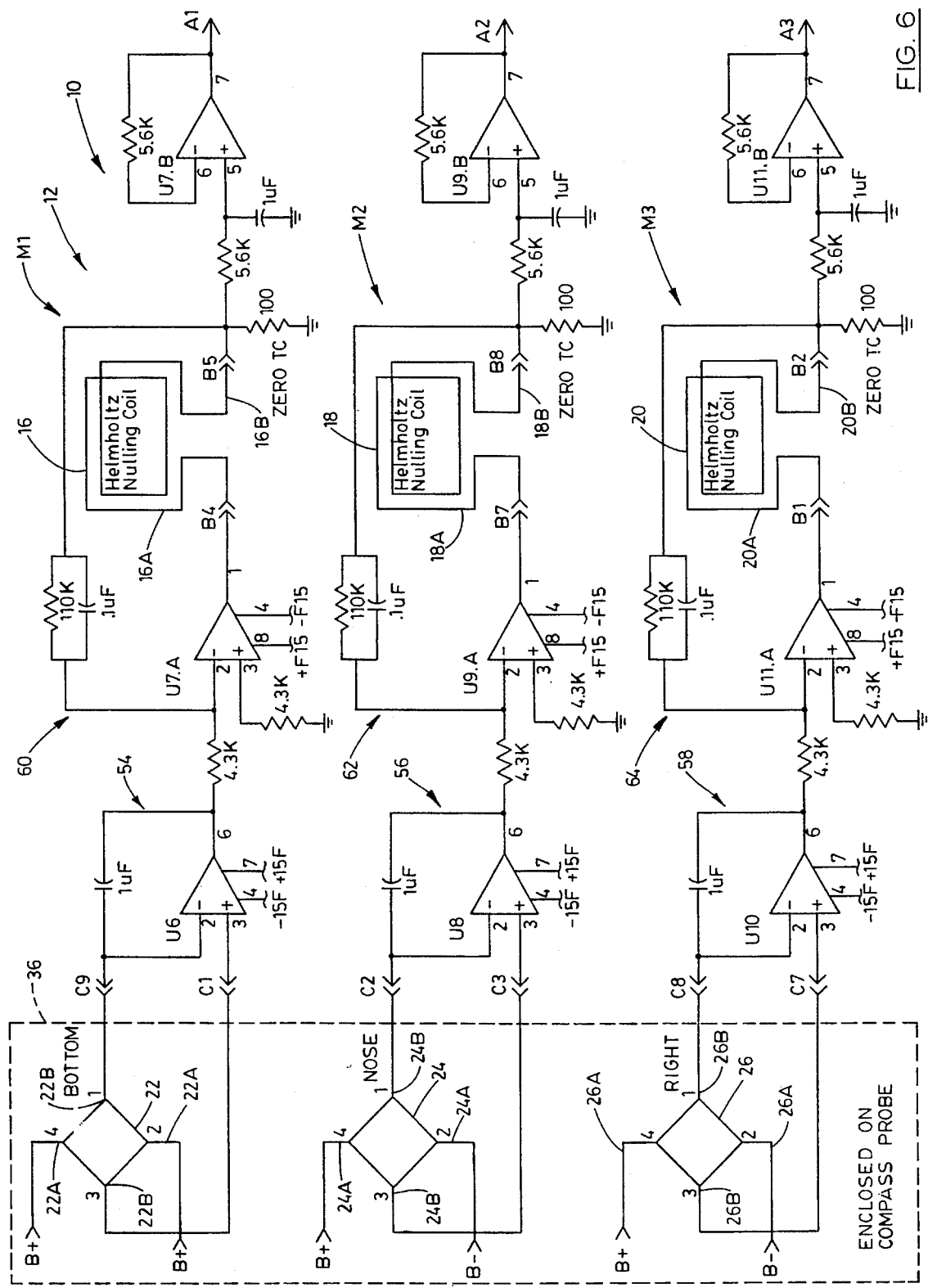
FIG. 6 is a detailed schematic circuit diagram of one implementation of the triaxial magnetic heading sensing apparatus of FIG. 1.

As best seen in FIG. 6, the nulling coils 16, 18, 20 and the sensors 22, 24, 26 together define three different measurement channels M1, M2, M3 of the sensing apparatus 10. The three different channels M1, M2, M3 are in an orthogonal relation to one another along three orthogonal sensing axes of the sensing apparatus 10 corresponding to the three orthogonal planes $P_1, P_2, P_3$. Each measurement channel M1, M2, M3 operates the same way so that together a three-dimensional magnetic vector is obtained by the measurement of the three vector components in the three measurement channels. Given additional data as to the orientation of the vertical direction vector, the magnetic field can be mathematically projected onto the horizontal plane so as to obtain a magnetic heading from essentially any platform attitude.

Referring back to FIGS. 2a, FIG. 2b, FIG. 3 and FIG. 4, the magnetic sensor portion 12 of the sensing apparatus 10 further includes a support block 34 for supporting the nulling coils 16, 18, 20 in the parallel relation to the three orthogonal planes $P_1, P_2, P_3$. about the common center point C, and a compass probe 36 for supporting the sensors 22, 24, 26 along the orthogonal axes and in close proximity to the common center point C. The support block 34 has a hollow interior cavity 38. Also, the support block 34 is cubic in shape and has a plurality of faces F. Further, the support block 34 has a plurality of linear recesses R defined in the faces F and extending about the support block 34 so as to provide a plurality of square-shaped grooves 40 about the exterior of the support block 34 defined in parallel relation to the three orthogonal planes $P_1, P_2, P_3$. The center of the support block 34 defines the common center point C.

The nulling coils 16, 18, 20 of the sensing apparatus 10 are located in the square-shaped grooves 40 of the support block 34. The grooves 40 are arranged in three sets of generally parallel pairs of the grooves so as to arrange the nulling coils 16, 18, 20 as three orthogonal helmholtz coil pairs with the coils of each pair being connected in a series aiding relation.

The compass probe 36 supporting the sensors 22, 24, 26 is disposed in the hollow interior cavity 38 of the support block 34. Referring to FIG. 6, each sensor 22, 24, 26 in a measurement channel M1, M2, M3 is configured as a four-element resistive bridge having first and second pairs of terminals. Each resistive element is composed of conductive magnetic material that exhibits the magnetoresistive effect. The four elements of the bridge are interconnected such that the bridge is approximately balanced in the absence of an applied magnetic field and becomes unbalanced when an external magnetic field is present. The first pair of terminals are the input 22A, 24A, 26A of sensor 22, 24, 26. The second pair of terminals are the ouput 22B, 24B, 26B of the sensor 22, 24, 26.

Figure 7:
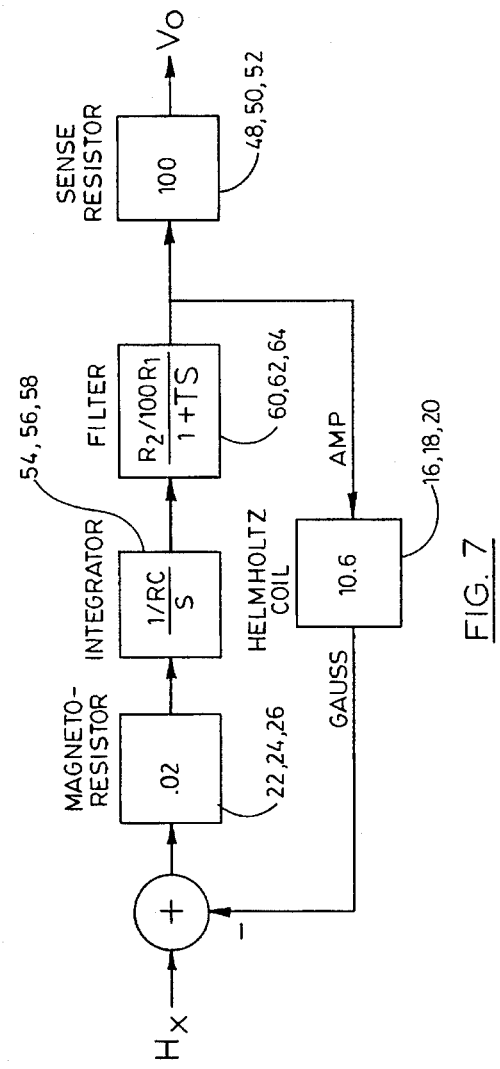
FIG. 7 is a simplified diagram of a servo control loop formed by components in each of three channels of the sensing apparatus of FIG. 6b.

Referring to FIGS. 1, 6 and 7, the magnetic sensor portion 12 of the sensing apparatus 10 still further includes coupling means 42, 44, 46 and output means 48, 50, 52 disposed in the respective three different measurement channels M1, M2, M3. Each coupling means 42, 44, 46 includes a voltage integrator 54, 56, 58 and a low pass filter 60, 62, 64 connected in series with one another and to the output 22B, 24B, 26B of a respective one sensor 22, 24, 26 in the respective measurement channel M1, M2, M3 for generating an error signal. The error signal generated at the output 22B, 24B, 26B of each sensor 22, 24, 26 of each respective channel M1, M2, M3 is representative of an imbalance of the sensor 22, 24, 26 due to the presence of an applied external magnetic field. The voltage integrator 54, 56, 58 and a low pass filter 60, 62, 64 of each coupling means 42, 44, 46 connect the inputs 16A, 18A,20A and outputs 16B,18B,20B of each nulling coil 16, 18, 20 and each magnetoresistive sensor 22, 24, 26 of the respective measurement channels M1, M2, M3 into respective servo control loops, as seen in FIG. 7, such that each sensor 22, 24, 26 is driven by the error signal to a magnetic nulling condition with zero steady state error. Each of the output means 48, 50, 52 in the respective measurement channels M1, M2, M3 is a pick-off resistor connected in series with the nulling coils 16, 18, and 20. Each pick-off resistor 48, 50, 52 produces as an output a voltage signal which is proportional to the current flowing in the nulling coils 16, 18, and 20 to provides a measure of the applied external magnetic field in the respective channel.

Figure 5:
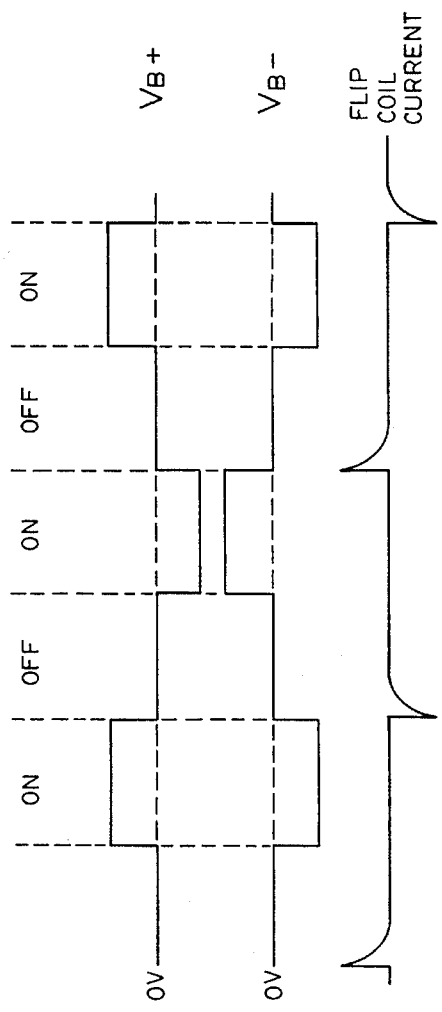
FIG. 5 is a simplified diagram depicting a signal excitation waveform applied to each of three magnetoresistive sensors of the apparatus of FIG. 1.

Referring to FIGS. 1, 5 and 6, the sensor excitation portion 14 of the sensing apparatus 10 is connected to the inputs 22A, 24A, 26A of the sensors 22, 24, 26 of the three different measurement channels M1, M2, M3 for exciting the sensors with a bipolar excitation voltage waveform, as depicted in FIG. 5, which exhibits alternating positive and negative voltage polarities punctuated by off states of substantially zero volts. The inputs of the sensors 22, 24, 26 are also identified as either B+ or B− which corresponds to the upper and middle waveforms depicted in FIG. 5. The sensor excitation portion 14 is also coupled to each of the flip coils 28, 30, 32 for activating the flip coils by generating a transient current therein, as depicted by the lower waveform in FIG. 5, which causes reversal of the magnetic polarity of the corresponding sensors 22, 24, 26 during the off states of the respective excitation voltage waveforms. Thus, the activation of the flip coils 28, 30, 32 causes flipping of the magnetic polarities of the sensors 22, 24, 26 between the alternations of excitation of the four-element resistive bridges defined by the sensors. While the excitation is active, the bridge outputs that result are normalized in polarity because the magnetic flip and the excitation flip effectively cancel. The benefit obtained from this double flipping mechanism is that first order offset voltages of the magnetoresistive sensors are transformed from DC to AC. The flipping action occurs at a rate that is high compared to the bandwidth of the measurement channel so that the AC offset voltage that results is attenuated to insignificance.

The output 22B, 24B, 26B of each magnetoresistive sensor 22, 24, 26 feeds the error signal to the respective voltage integrator 54, 56, 58 whose outputs feed the low pass filter 60, 62, 64 which, in turn, drive the nulling coils 16, 18, 20. By the servo control loops operating as a type 1 closed loop servo, the sensors 22, 24, 26 are driven to a magnetic nulling condition with zero stead state error. The measure of the magnetic field is obtained from the determination of the current required to drive the magnetic field at the center of the support block 34 to the null condition. The determination of the nulling current is established by measurement of the voltage across the respective precision pick-off resistors 48, 50, 52.

More particularly, the sensor excitation portion 14 includes a bridge 66 and a signal timing generator 68. The bridge 66 is defined by a plurality of low resistance MOSFET devices Q3, Q4, Q5, Q6 connected in an H-shaped configuration. The sensors 22, 24, 26 at first pair of terminals or inputs 22A, 24A, 26A thereof are connected to the output terminals 66A of the H-shaped bridge 66 in a parallel relation. The signal timing generator 68 includes a clock generator 70 and a finite state machine implemented in a programmable array logic (PAL) device 72. The PAL device 72 is driven by the clock generator 70 and is connected to the input terminals 66B of the H-shaped bridge 66 for feeding signals to the H-shaped bridge which determine the timing for the excitation waveform and for the flip current drive. The flip current drive is generated by a voltage square wave which is differentiated by a capacitor 74 in series with the three series connected flip coils 28, 30, 32. The "off" periods of the bridge excitation waveform are set long enough so that the flip coil current pulses have completely died out before the magnetoresistive bridge is reactivated by application of a differential voltage.

Magnetoresistive Bridge Excitation

One particularly advantageous and unique technique employed by the apparatus 10 of the present invention is the technique of exciting the magnetoresistive bridge with an AC waveform, as depicted in FIG. 5. One manufacturer of the magnetoresistive sensors 22, 24, 26 utilized in the apparatus 10 is Philips Components Corp. In the manufacturer's data sheet and Technical Publication No. 268, the bridge excitation terminals are referred to as $V_B+$ and $V_B-$. Throughout the manufacturer's literature, the sensors are described in terms of the application of positive and negative DC voltages to the bridge input terminals. That is the traditional method by which resistive bridge type sensors are utilized.

The manufacturer's technical publication, as referenced above, describes the use of the magnetic flipping technique to mitigate the effects of bridge output effects. In the technical publication, a schematic diagram and text disclosure is made of a scheme by which the bridge output terminals are electronically reversed in concert with the magnetic flipping action of a flip coil.

Experiments were conducted by the inventors using the reversing approach described in the manufacturer's application note. It was determined that there were small but significant errors introduced by the output reversing mechanism and that the electronic switching added considerable complexity to the circuit. When switching the bridge outputs, errors result from the usual limitations of electronic switching devices; those include charge injection and variation of on resistance.

These errors are eliminated and the circuit is made simpler when the bridge excitation is driven by an AC waveform as depicted in FIG. 5. By driving the bridge excitation with a waveform that includes off states, the magnetic transients associated with the application of the flip current pulses are very effectively precluded. Also, the circuitry required to generate the bridge excitation, which has been described earlier, can be shared by all three channels operating in parallel whereas output switching mechanisms must be duplicated on each channel.

Simultaneous Nulling

Another particularly advantageous and unique technique employed by the apparatus 10 of the present invention is the physical configuration of the support block 34 wherein all three orthogonal nulling planes $P_1, P_2, P_3$. operate to achieve a magnetic nulling condition simultaneously and coincidentally in space. Under these conditions, the nulling planes are essentially immune to misalignment of the magnetoresistive sensors 22, 24, 26. In the topology of the sensing apparatus 10 of the present invention, the closed loop sensing axes of the three measurement channels M1, M2, M3 are precisely defined by the exterior squareness of the support block 34 and the coil grooves 40.

To understand this characteristic of the present invention, consider an instance of the design with only one channel operating. Now consider that the particular magnetoresistive sensor is misaligned from the axis of the nulling channel by a small angle. The misalignment may be due either to the inherent misalignment of the magnetoresistive substrate within its molded plastic package or the misalignment may be due to the angular assembly tolerances of the compass sensor probe 36. When this single channel sensor is driven to null an error will be manifest by the coupling of any orthogonal magnetic field components that the sensor will detect as a result of its misalignment. In effect, the orthogonal components of the magnetic field will bias the sensor so that an error will be registered which is proportional to the strength of the orthogonal field component in the plane of the misalignment and related to the degree of the misalignment.

Now consider the situation with all three channels operating. The channel under consideration still has sensor misalignment. Now, however, the operating orthogonal channels have driven the cross fields to zero at the center of the support block. There are no longer orthogonal field components to couple into the sensor and create bias errors. Even though the null detection sensor itself is substantially misaligned to the null coil axis, that misalignment has essentially no influence on the directionality of the closed loop measurement channel as established by the null coil axis direction.

This aspect of the present invention results in substantial improvement in accuracy and reduction in manufacturing cost. The exterior squareness of the support block 34 and the helmholtz coil grooves 40 can be established to high precision such as by machining. Also, an accurate support block can be fabricated at low cost by injection molding processes. Other than the exterior dimensionality and squareness of the support block, all remaining aspects of the fabrication of the device can be made to loose manufacturing tolerances.

A mathematically rigorous proof of the simultaneous nulling principle has been performed for a two dimensional subset of the topology. The proof can be readily extended to the three dimensional case. Parenthetically, the proof will not be described herein as it is not believed to be necessary to do so for one of ordinary skill in the art to fully understand the sensing apparatus 10 of the present invention and for reason that the proof would only serve to unnecessarily complicate the explanation of the present invention. The statement of the resulting theorem is as follows: Given the topology of three accurately orthogonal concentric helmholtz coils and three magnetic field sensors coarsely aligned to the helmholtz axes and collocated near the center of the concentric coils, then the three orthogonal components of the magnetic field can be determined by simultaneously nulling the three sensors. The resultant accuracy is limited only by the geometric accuracy of the helmholtz coils; misalignment of the null detecting sensors contributes no error.

There is a mechanical interference problem in contemplation of identical pairs of orthogonal helmholtz coils acting on a common geometric center point in space; the wires of the coils would need to cross through one another.

The solution to this dilemma was to make the coil pairs of slightly different dimensions as controlled by the depth of the coil grooves 40. The three coil sets in the present embodiment are therefor concentric. The ratios of the dimensions of the concentric helmholtz coils were established to be compensated by integer turns ratios. The coil turns were wound as 47, 48 and 49 turns for inner, middle and outer helmholtz coils respectively; that turns ratio precisely compensates the 1/r relationship of coil dimension to magnetic field strength so that nulling currents applied to the three helmholtz coils have identical scale factors.

A similar issue relates to the problem of collocating the three magnetoresistive sensors at the center of the support block; since the sensors have finite dimensionality, they cannot share the geometric center point of the block. A practical compromise is to slightly displace each sensor equally from the geometric center point. This works well because it is the nature of the helmholtz coil that the magnetic field near the center of the coil pair is uniform; in fact, it is that characteristic that gives the helmholtz coil engineering significance and application in the present invention.

By application of the Biot-Savart law, numerical calculations of the square coil helmholtz configuration have revealed that for radial or axial displacements of up to ten percent of the coil spacing the field variation is less than 100 parts per million. Furthermore, the potential for measurement error is mitigated by the fact that each sensor is displaced approximately the same amount from the center point so that the scaling ratios associated with the displacement from center are approximately equal for the three channels. Since compass heading calculations involve only the ratios of the magnetic field components, there is no first order influence from this otherwise small effect.

Conclusions and Ramifications

In conclusion, the triaxial magnetic heading sensing apparatus 10 provides electrical output signals which permit the display of magnetic heading information on electronic display devices. The sensing apparatus 10 also permits electronic recording of magnetic heading information and electronic transmission of heading information. The sensing apparatus 10 has particular utility with respect to the need for directional heading feedback in electronically controlled unmanned vehicles, such as for example, missiles, drones, land rovers and torpedoes.

The sensing apparatus 10 can be used in a strap-down configuration such that no gimbal structures are required. Gimbal structures, as normally associated with two axes type electronic compass sensors, involve considerable mechanical complication and often have a limited range of proper operation with respect to vehicle attitude. Gimbal structures may also introduce their own mechanical dynamics due to rotational inertia that adds computational complications and errors.

The sensing apparatus 10 provides means to fully resolve the three dimensional direction of the local earth's field vector relative to a platform on which it is mounted. That capability, when augmented by a mechanism for determining a vertical projection vector, provides a direct means for calculating a vehicle's magnetic heading. An accurate magnetic heading can thus be calculated in essentially any vehicle attitude and during rapid vehicle maneuvering with on degradation of performance.

In one application of the present invention, the triaxial magnetic heading sensing apparatus 10 is used in a strap-down configuration in conjunction with a triaxial system of adaptively stabilized strap-down gyroscopes. In this application, the gyroscopes provide the vertical projection reference that is required to resolve the magnetic field vector into the horizontal plane. The sensing apparatus 10, in turn, functions to adaptively stabilize the gyroscopic azimuth direction representation. Other mechanisms, involving the use of accelerometers and the vehicle's flight dynamics, are employed to adaptively stabilize the gyroscopic elevation and roll direction representations.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the forms hereinbefore described being merely exemplary embodiments thereof.

Having thus described the invention, what is claimed is:

1. A magnetic sensing apparatus, comprising;
   (a) a plurality of nulling coils having inputs and outputs and being arranged in generally parallel relation to three orthogonal planes intersecting at a common center point;
   (b) a plurality of magnetoresistive sensors having inputs and outputs and being disposed along orthogonal axes arranged in generally parallel relation to said orthogonal planes and in close proximity to said common center point, each of said sensors generating an electric signal in the presence of an applied external magnetic field:
   (c) means connected to said outputs of said magnetoresistive sensors for generating an error signal representative of an imbalance due to the presence of an applied external magnetic field and for coupling said inputs and outputs of said nulling coils and said magnetoresistive sensors into a servo control loop such that each said magnetoresistive sensor is driven by said error signal to a magnetic nulling condition with zero steady state error;
   (d) means connected to said servo control loop for outputting said error signal to provide a measure of the applied external magnetic field; and
   (e) a support block having an exterior and a hollow interior cavity and a center, said support block being cubic in shape and having a plurality of faces and a plurality of linear recesses defined in said faces about said support block so as to provide a plurality of square-shaped grooves about said exterior of said support block in said parallel relation to said three orthogonal planes, said common center point being the same as said center of said support block, said nulling coils being located in said grooves.

2. The apparatus of claim 1 wherein said grooves are arranged in three sets of generally parallel pairs of grooves so as to arrange said nulling coils as three orthogonal helmholtz coil pairs with said coils of each pair connected in a series aiding relation.

3. The apparatus of claim 1 further comprising a means for supporting said sensors along said orthogonal axes and in close proximity to said common center.

4. The apparatus of claim 3 wherein said sensor supporting means is a compass probe disposed in said hollow interior cavity of said support block.

5. The apparatus of claim 1 wherein said nulling coils are arranged as three orthogonal helmholtz coil pairs.

6. A magnetic sensing apparatus, comprising:
   (a) a plurality of nulling coils having inputs and outputs and being arranged in generally parallel relation to three orthogonal planes intersecting at a common center point;
   (b) a plurality of magnetic field sensors having inputs and outputs and being disposed along orthogonal axes arranged in generally parallel relation to said orthogonal planes and in close proximity to said common center point, each of said sensors generating an electric signal in the presence of an applied external magnetic field;
   (c) means connected to said outputs of said sensors for generating an error signal representative of imbalance due to the presence of an applied external magnetic field and for coupling said inputs and outputs of said nulling coils and said magnetoresistive sensors into a servo control loop such that each said sensor is driven by said error signal to a magnetic nulling condition with zero steady state error;
   (d) means connected to said servo control loop for outputting said error signal to provide a measure of the applied external magnetic field: and
   (e) a means connected to said inputs of said sensors for exciting said sensors with a bipolar excitation voltage waveform exhibiting alternating positive and negative voltage polarities punctuated by off states of substantially zero volts.

7. The apparatus of claim 6 wherein said sensor exciting means includes:
   a bridge defined by a plurality of low resistance MOSFET devices connected in an H-shaped configuration, said sensors at said first pair of terminals of each of said sensors being connected to said H-shaped bridge in a parallel relation; and
   means connected to said H-shaped bridge for feeding signals to said H-shaped bridge for determining the timing for said excitation waveform.

8. The apparatus of claim 6 wherein said coupling means includes a voltage integrator and a low pass filter connected in series to the output of a respective one of said sensors for generating said error signal.

9. The apparatus of claim 8 wherein said outputting means is a pick-off resistor connected to an output of said low pass filter.

10. The apparatus of claim 6 further comprising a plurality of flip coils each being wound around one of said sensors, said exciting means being coupled to said flip coils for activating said flip coils to cause reversal of magnetic polarity of said sensors during said off states of said excitation voltage waveform.

11. A triaxial magnetic heading sensing apparatus, comprising:
   (a) a plurality of nulling coils having inputs and outputs and being arranged in generally parallel relation to three orthogonal planes intersecting at a common center point;
   (b) a plurality of magnetoresistive sensors having inputs and outputs and being disposed along orthogonal axes arranged in generally parallel relation to said orthogonal planes and in close proximity to said common center point, each of said sensors having a bridge configuration approximately balanced in the absence of an applied external magnetic field and unbalanced in the presence of an applied external magnetic field, said nulling coils and said sensors defining three different measurement channels corresponding respectively to the three orthogonal planes and axes thereof;

(c) a support block having an exterior and a hollow interior cavity and a center, said support block being cubic in shape and having a plurality of faces and a plurality of linear recesses defined in said faces about said support block so as to provide a plurality of square-shaped grooves about said exterior of said support block in said parallel relation to said three orthogonal planes, said common center point being the same as said center of said support block, said nulling coils being located in said grooves;

(d) a compass probe supporting said sensors along said orthogonal axes and in close proximity to said common center, said compass probe being disposed in said hollow interior cavity of said support block;

(e) means connected to said inputs of said sensors of said three different channels for exciting said sensors with a bipolar excitation voltage waveform exhibiting alternating positive and negative voltage polarities punctuated by off states of substantially zero volts;

(f) means disposed in each of said three different channels being connected to said output of said sensor of a respective one channel for generating an error signal representative of an imbalance of said sensor of said one channel due to the presence of an applied external magnetic field and for coupling said inputs and outputs of said nulling coil and said magnetoresistive sensor of said respective one channel into a servo control loop such that each said sensor is driven by said error signal to a magnetic nulling condition with zero steady state error; and (g) means connected to said servo control loop for outputting said error signal to provide a measure of the applied external magnetic field.

12. The apparatus of claim 11 wherein said grooves are arranged in three sets of generally parallel pairs of grooves so as to arrange said nulling coils as three orthogonal helmholtz coil pairs with said coils of each pair connected in a series aiding relation.

13. The apparatus of claim 11 wherein each of said sensors in said channels is configured as a four-element resistive bridge having first and second pairs of terminals, said first pair of terminals being said input of said sensor connected to said exciting means, said second pair of terminals being said output of said sensor connected to said servo control loop defining means.

14. The apparatus of claim 13 wherein said sensor exciting means includes:

a bridge defined by a plurality of low resistance MOSFET devices connected in an H-shaped configuration, said sensors at said first pair of terminals of each of said sensors being connected to said H-shaped bridge in a parallel relation; and means connected to said H-shaped bridge for feeding signals to said H-shaped bridge for determining the timing for said excitation waveform.

15. The apparatus of claim 11 wherein said coupling means in each of said channels includes a voltage integrator and a low pass filter connected in series to the output of a respective one said sensor in said channel for generating said error signal.

16. The apparatus of claim 11 wherein said outputting means in each of said channels is a pick-off resistor connected to an output of said low pass filter in said respective channel.

17. The apparatus of claim 6 wherein said nulling coil supporting means is a support block having an exterior and a hollow interior cavity and a center, said support block being cubic in shape and having a plurality of faces and a plurality of linear recesses defined in said faces about said support block so as to provide a plurality of square-shaped grooves about said exterior of said support block in said parallel relation to said three orthogonal planes, said common center point being the same as said center of said support block, said nulling coils being located in said grooves.

18. The apparatus of claim 17 wherein said grooves are arranged in three sets of generally parallel pairs of grooves so as to arrange said nulling coils as three orthogonal helmholtz coil pairs with said coils of each pair connected in a series aiding relation.

19. The apparatus of claim 17 further comprising a means for supporting said sensors along said orthogonal axes and in close proximity to said common center.

20. The apparatus of claim 19 wherein said sensor supporting means is a compass probe disposed in said hollow interior cavity of said support block.

21. The apparatus of claim 6 wherein said nulling coils are arranged as three orthogonal helmholtz coil pairs.

22. The apparatus of claim 6 wherein each of said magnetoresistive sensors is configured as a four-element resistive bridge having first and second pairs of terminals, said first pair of terminals being said input of said sensor connected to said exciting means, said second pair of terminals being said output of said sensor connected to said servo control loop defining means.

* * * * *